United States Patent [19]

Yoneda et al.

[11] Patent Number: 4,464,455
[45] Date of Patent: Aug. 7, 1984

[54] DRY-DEVELOPING NEGATIVE RESIST COMPOSITION

[75] Inventors: Yasuhiro Yoneda, Machida; Kenroh Kitamura, Fujisawa; Jiro Naito, Kanagawa; Toshisuke Kitakohji, Machida, all of Japan

[73] Assignee: Fujitsu Limited, Kawasaki, Japan

[21] Appl. No.: 385,887

[22] Filed: Jun. 7, 1982

[30] Foreign Application Priority Data

Jun. 9, 1981 [JP] Japan ................................. 56-87568

[51] Int. Cl.$^3$ ............................................... G03C 5/16
[52] U.S. Cl. .............................. 430/270; 204/159.13; 430/296; 430/325; 430/942; 430/271
[58] Field of Search ............... 430/281, 285, 286, 311, 430/313, 942, 967, 270, 271, 296, 325, 330; 204/159.13, 159.22

[56] References Cited

U.S. PATENT DOCUMENTS

| | | | |
|---|---|---|---|
| 2,892,712 | 6/1959 | Plambeck | 430/281 X |
| 4,018,937 | 4/1977 | Levine et al. | 430/281 X |
| 4,092,442 | 5/1978 | Agnihotri et al. | 430/330 X |
| 4,232,110 | 11/1980 | Taylor | 430/313 |
| 4,241,165 | 12/1980 | Hughes et al. | 430/313 X |
| 4,301,231 | 11/1981 | Atarashi et al. | 430/296 X |
| 4,396,704 | 8/1983 | Taylor | 430/311 |

FOREIGN PATENT DOCUMENTS 67067 12/1982 European Pat. Off. ............ 430/270

OTHER PUBLICATIONS

Hiroki Kuwano, Kazue Yoshida and Shin-ichi Yamazaki, "Dry Development of Resists Exposed to Focused Gallium Ion Beam", *Japanese Journal of Applied Physics*, vol. 19, No. 10, Oct. 1980, pp. L615-L617.
R. Feder et al., "Dry Development of Photoresists", *IBM Technical Disclosure Bulletin*, vol. 19, No. 1, Jun. 1976, p. 316.
K. Nate and T. Kobayashi, "Poly p-Substituted Phenyl Isopropyl Ketones for Positive Photoresists", *Journal of the Electrochemical Society*, (USA), vol. 128, No. 6, Jun. 1981, pp. 1394-1395.

*Primary Examiner*—John E. Kittle
*Assistant Examiner*—Cynthia Hamilton
*Attorney, Agent, or Firm*—Staas & Halsey

[57] ABSTRACT

A dry-developing negative resist composition consisting of (a) a polymer of a monomer of the following formula I or II or a copolymer of a monomer of the following formula I with a monomer of the following formula II,

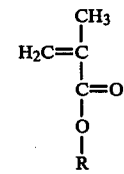

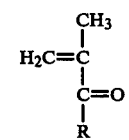

in which R represents alkyl of 1 to 6 carbon atoms, benzyl, phenyl, or cyclohexyl and (b) 1% to 70% by weight, based on the weight of the composition, of a silicone compound. A negative resist pattern can be formed on a substrate by a process comprising coating the substrate with the resist composition, exposing the resist layer to an ionizing radiation, subjecting the resist layer to a relief treatment, and developing a resist pattern on the substrate by treatment with gas plasma.

15 Claims, 2 Drawing Figures

DRY-DEVELOPING NEGATIVE RESIST COMPOSITION

BACKGROUND OF THE INVENTION

The invention relates to a dry-developing negative resist composition. More particularly, the invention relates to a negative resist composition which can be developed through an oxygen plasma, argon gas plasma, mixed oxygen-argon gas plasma, or mixed oxygen-fluorine gas plasma after its exposure to ionizing radiation such as an electron beam, X-ray, ion beam, or deep ultraviolet ray.

Resists developed using developing liquids have heretofore been used for forming resist patterns in the manufacture of electronic devices such as semiconductor integrated circuits. For instance, polymethyl methacrylate has been used as a positive electron beam resist, and polyglycidyl methacrylate has been used as a negative electron beam resist. Conventional resists developed using developing liquids, however, swell or shrink when developed, thus making it difficult to form patterns of the order of submicrons.

On the other hand, dry-developing resists have recently been developed, as disclosed, for example, in "Plasma-Developed X-Ray Resists", J. Electrochem. Soc., Vol. 127, No. 12, pp 2665 to 2674. However, conventional dry-developing resists do not have a resistance to plasma high enough for the formation of very fine resist patterns.

SUMMARY OF THE INVENTION

Therefore, it is the primary object of the present invention to make it possible to form resist patterns by dry-developing wherein fine resist patterns can easily be formed.

According to the present invention, there is provided a dry-developing negative resist composition consisting of (a) a polymer of a monomer of the following formula I or II or a copolymer of a monomer of the following formula I with a monomer of the following formula II,

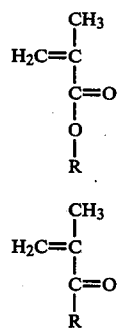

in which R represents alkyl of 1 to 6 carbon atoms, benzyl, phenyl, or cyclohexyl and (b) 1% to 70% by weight, based on the weight of the composition, of a silicon compound.

The present invention also provides a process for forming a negative resist pattern on a substrate, comprising coating the substrate with the resist composition, exposing the resist layer to ionizing radiation, subjecting the resist layer to relief treatment, and developing the resist pattern on the substrate by treatment with a gas plasma.

BRIEF DESCRIPTION OF THE DRAWINGS

In the accompanying drawings.

DETAILED DESCRIPTION OF THE PREFERRED EMBODIMENTS

The present invention is based upon the fact that polymers which react with a silicone compound upon irradiation with ionizing radiation form compounds which produce a vapor pressure lower than the vapor pressure produced by the silicone compound without the irradiation and the fact that the silicone compound of the exposed portions converts, through treatment with plasma, into a substance having increased resistance to the plasma. To attain a high selective etching ratio, it is essential to subject the resist layer to relief treatment after it has been exposed to ionizing radiation.

Examples of the polymers of monomers represented by the general formula I include polymethyl methacrylate, polyethyl methacrylate, poly-n-propyl methacrylate, poly-i-propyl methacrylate, poly-n-butyl methacrylate, poly-sec-butyl methacrylate, poly-t-butyl methacrylate, poly-n-amyl methacrylate, poly-n-hexyl methacrylate, polybenzyl methacrylate, polyphenyl methacrylate, and polycyclohexyl methacrylate. Examples of polymers of monomers represented by the general formula II include polymethylisopropenyl ketone and polyphenylisopropenyl ketone. In the present invention, copolymers of monomers of formula I with monomers of formula II can also be used advantageously.

The silicon compound may preferably be contained in the resist composition in an amount of 10% to 50% by weight based on the weight of the composition.

Examples of the silicon compound usable for the present invention include the compounds represented by the following formulae III, IV, V, VI, and VII,

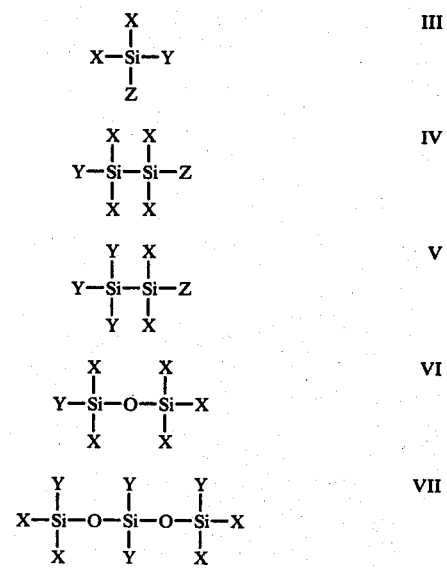

in which X represents methyl, phenyl, biphenyl, phenylamino, phenoxy, benzyl, cyano, vinyl, or acetoxy; Y represents hydrogen, hydroxy, azido, vinyl, methoxy, ethoxy, butoxy, phenoxy, halogen, benzyl, phenyl, methyl, t-butyl biphenyl, or acetoxy; and Z represents phenyl, hydroxy, vinyl, methoxy, ethoxy, butoxy, benzyl, methyl, t-butyl, phenoxy, halogen, biphenyl, or acetoxy.

Examples of the compounds of the above formula III include bis(p-biphenyl)diphenylsilane, bis(-phenylamino)dimethylsilane, t-butyldimethylchlorosilane, t-butyldiphenylchlorosilane, dibenzyldimethylsilane, dicyanodimethylsilane, diphenylsilanediol, tetraacetoxysilane, tetraphenoxysilane, tetraphenylsilane, tribenzylchlorosilane, triphenylchlorosilane, triphenylethylsilane, triphenylfluorosilane, triphenylsilane, triphenylsilanol, triphenylsilylazido, and triphenylvinylsilane.

Examples of the compounds of formula IV and V include 1,2-dimethyl-1,1,2,2-tetraphenyldisilane and 1,1,1-trimethyl-2,2,2-triphenyldisilane, and examples of the compounds of formula VI include 1,3-dimethyl-1,1,3,3-tetraphenyldisiloxane, 1,3-divinyl-1,1,3,3-tetraphenyldisiloxane, and 1,3-ethoxy-1,1,3,3-tetraphenyldisiloxane. As an example of the compounds of formula VII, there may be mentioned 1,1,5,5-tetraphenyl-1,3,3,5-tetramethyltrisiloxane.

A further example of the silicon compound is 1,4-bis(-hydroxydimethylsilyl)benzene.

Figure 1A:
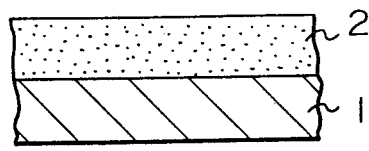
FIG. 1 is a flow sheet which schematically illustrates steps A through D of an embodiment of the process of the present invention.
Figure 1B:
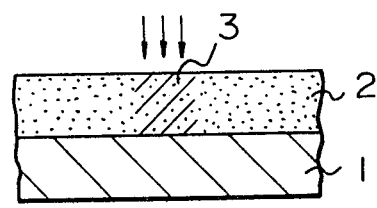
Figure 1C:
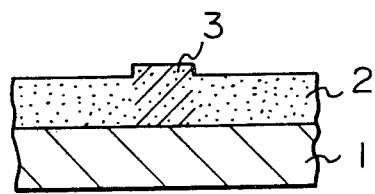
Figure 1D:
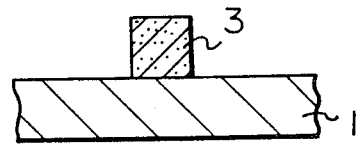

The process for forming patterns according to the present invention is carried out through the following procedure in line with conventional techniques. Referring to FIG. 1, a resist layer 2 is formed on a substrate 1 at step A. For example, the resist composition is applied by spin-coating and is prebaked at a temperature of 60° C. to 80° C. for 10 to 30 minutes. The resist layer is then exposed to an electron beam or the like in step B. Thus, the silicon compound in the exposed portion 3 of the resist layer 2 is converted to a silicon compound which produces a vapor pressure lower than that produced by the original silicon compound. The resist layer is then subjected to relief treatment at step C. The relief treatment may consist of treatment under heated conditions; treatment under vacuum conditions, ortreatment under vacuum and heated conditions. Thus, part or almost all of the unexposed portion of the silicon compound is removed. The resist layer 2 is then dry-developed. That is, at step D, the resist layer 2 is treated with gas plasma such as oxygen plasma, argon gas plasma, mixed oxygen-argon gas plasma, or mixed oxygen-fluorine gas plasma, so that the unexposed portion is removed and so that the exposed portion 3 will remain as the desired resist pattern.

Figure 2A:
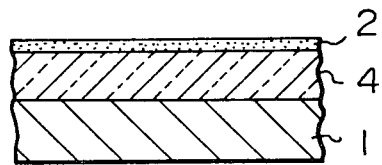
FIG. 2 is a flow sheet which schematically illustrates steps A through E of another embodiment of the process of the present invention.
Figure 2B:
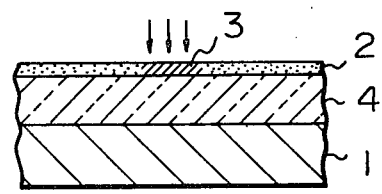
Figure 2C:
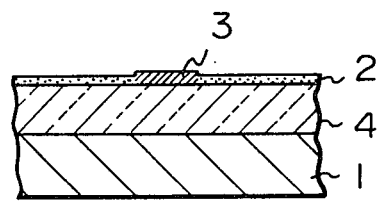
Figure 2D:
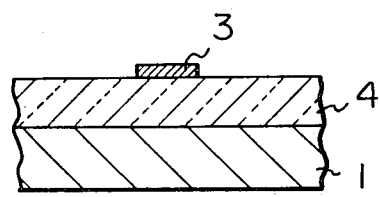
Figure 2E:
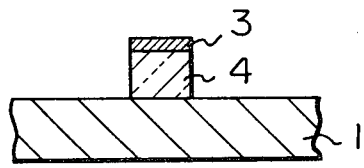

Referring to FIG. 2, if desirable, an intermediate layer 4 may be provided between the substrate 1 and the resist layer 2. For example, an intermediate layer 4 is formed on a substrate 1 at step A. The formation of the intermediate layer 4 may be effected by applying a plasma-etchable substance, such as polyvinyl carbazole, polystyrene, phenol resin, cyclized polyisoprene resin, cyclized polyisoprene resin, or polyimide, onto the substrate by spin-coating or plasma polymerization. Then, a resist layer 2 is applied onto the intermediate layer also at step A in the same manner as described above with respect to FIG. 1. Then, the resist layer is exposed to radiation at step B, and relief treatment is effected at step C. The exposed portion 3 of the resist layer 2 is then removed through treatment with oxygen plasma or the like at step D. The plasma treatment is continued at step E, to etch the intermediate layer 4, so that the desired pattern may be obtained.

According to the present invention, there can be obtained a negative resist which can be dry-developed through treatment with plasma and which has a high selective etching ratio and a high film retentivity.

The invention will be described below in further detail by way of working examples. The molecular weight $\overline{Mw}$ of the polymer used in these examples was 8 to $45 \times 10^4$, and the dispersion degree $\overline{Mw}/\overline{Mn}$ was from 1.4 to 3.2. The sensitivity was represented in terms of the exposure amount when the film thickness after developing became 50% of the initial film thickness. The film retentivity (percentage of residual film thickness) was represented in terms of a normalized film thickness when the film thickness after developing became constant.

EXAMPLE 1

Polymethyl methacrylate (PMMA) was blended with 23.1% by weight of triphenylsilane and was dissolved in cyclohexanone. The concentration of the polymer was about 11% by weight. The solution was applied onto a silicon wafer using a spinner at a revolving speed of 2,500 to 3,500 rpm and was heat-treated at 60° to 80° C. for 10 to 30 minutes. The thickness of the obtained resist layer was 1 to 1.4 $\mu$m. The specimen was then exposed to an electron beam produced at an acceleration voltage of 20 kV for a total of 25 minutes and was introduced into a reactive ion etching apparatus of the parallel plate-type. After the pressure was reduced to $6 \times 10^{-5}$ Torr, oxygen was introduced to increase the pressure to 0.4 Torr, and the specimen was developed under the conditions of an applied electric power of 0.22 to 0.33 watt/cm$^2$ and an applied frequency of 13.56 MHz. The thickness of the film of the unexposed portion became zero after it was developed for 21 minutes and 30 seconds. The thickness of the remaining film was measured to find the sensitivity and the film retentivity. The sensitivity was $5.6 \times 10^{-4}$ C/cm$^2$, and the film retentivity was 82%.

EXAMPLE 2

A specimen was prepared in the same manner as in Example 1 by using poly-i-propyl methacrylate (Pi-PMA), instead of PMMA, and was exposed and dry-developed in the same manner as in Example 1. The thickness of the resist film was 1.23 $\mu$m, and the developing time was 23 minutes and 45 seconds. The sensitivity was $2.8 \times 10^{-4}$ C/cm$^2$, and the film retentivity was 87%.

EXAMPLE 3

A specimen was prepared in the same manner as in Example 1 by using poly-t-butyl methacrylate (Pt-BMA), instead of PMMA, and was exposed and dry-developed in the same manner as in Example 1. The thickness of the resist film was 1.18 $\mu$m, and the developing time was 20 minutes and 30 seconds. The sensitivity was $4.3 \times 10^{-4}$ C/cm$^2$, and the film retentivity was 85%.

EXAMPLE 4

A specimen was prepared in the same manner as in Example 1 using poly-n-butyl methacrylate (Pn-BMA), instead of PMMA, and was exposed and dry-developed in the same manner as in Example 1. The thickness of the resist film was 1.18 μm, and the developing time was 15 minutes. The sensitivity was $4 \times 10^{-5}$ C/cm², and the film retentivity was 84%.

EXAMPLE 5

A specimen was prepared in the same manner as in Example 1 by using a copolymer [P(BzMA-MMA)] consisting of a benzyl methacrylate and a methyl methacrylate at an equal molar ratio, instead of PMMA, and was exposed and dry-developed in the same manner as in Example 1. The thickness of the resist film was 1.3 μm, and the developing time was 46 minutes. The sensitivity was $2.1 \times 10^{-4}$ C/cm², and the film retentivity was 80%.

EXAMPLE 6

A specimen was prepared in the same manner as in Example 1 by using polyisopropenylketone (PMIPK), instead of PMMA, and was exposed and dry-developed in the same manner as in Example 1. The thickness of the resist film was 0.85 μm, and the developing time was 12 minutes. The specimen which had been exposed to the electron beam was further treated under a reduced pressure of $1 \times 10^{-5}$ Torr for one hour. The sensitivity was $7.5 \times 10^{-4}$ C/cm², and the film retentivity was 72%.

EXAMPLE 7

Pn-BMA was blended with 16.7% by weight of triphenylsilanol and was dissolved in cyclohexanone. The solution was applied onto a silicon wafer by a spin coater and was heated in a nitrogen stream at 60° C. for 20 minutes. The thickness of the resist film was 1.35 μm. The specimen was exposed to an electron beam generated at an acceleration voltage of 20 kV (for a total of 25 minutes) and was treated under a reduced pressure of $1 \times 10^{-5}$ Torr for one hour. Thereafter, the specimen was dry-developed in the same manner as in Example 1. In this case, the applied electric power was 0.33 watt/cm², and the developing time was 9 minutes and 30 seconds. The sensitivity was $2.9 \times 10^{-5}$ C/cm², and the film retentivity was 88%.

EXAMPLE 8

A specimen was prepared in the same manner as in Example 7 by adding 16.7% by weight of triphenylsilylazido to Pn-BMA. The thickness of the film was 1.4 μm. Since triphenylsilylazido was sensitive to light, it had to be treated in a darkroom. After exposure to the electron beam, the specimen was treated under a reduced pressure of $1 \times 10^{-5}$ Torr for one hour and was then developed in the same manner as in Example 7. In this case, the applied electric power was 0.22 watt/cm², and the developing time was 33 minutes and 30 seconds. The sensitivity was $2 \times 10^{-5}$ C/cm², and the film retentivity was 82%.

EXAMPLE 9

A specimen was prepared in the same manner in Example 7 by adding 16.7% by weight of triphenylvinylsilane to Pn-BMA. The thickness of the film was 1.38 μm. After exposure to the electron beam, the specimen was heated at 80° C. in a nitrogen stream for 30 minutes and was developed in the same manner as in Example 7. In this case, the applied electric power was 0.22 watt/cm², and the developing time was 18 minutes and 45 seconds. The sensitivity was $2.7 \times 10^{-5}$ C/cm², and the film retentivity was 86%.

EXAMPLE 10

A specimen was prepared in the same manner as in Example 7 by adding 16.7% by weight of diphenylsilanediol to Pn-BMA. The thickness of the film was 1.18 μm. After exposure to the electron beam, the specimen was treated under a reduced pressure of $1 \times 10^{-5}$ Torr for one hour and was then developed in the same manner as in Example 7. In this case, the developing time was 10 minutes and 45 seconds. The sensitivity was $4.5 \times 10^{-6}$ C/cm², and the film retentivity was 97%.

EXAMPLE 11

A specimen was prepared as described in Example 7 using a blend of a poly-iso-butyl methacrylate (Pi-BMA) with 20% by weight of 1,3-divinyl-1,1,3,3-tetraphenyldisiloxane. The thickness of the resist film was 1.1 μm. After exposure to the electron beam, the specimen was subjected to vacuum treatment under a pressure of $1 \times 10^{-5}$ Torr for 2 hours and, then, developed as described in Example 7 for 9 minutes and 30 seconds. The sensitivity was $6.8 \times 10^{-5}$ C/cm², and the film retentivity was 90%.

EXAMPLE 12

A specimen was prepared as described in Example 7 using a blend of Pi-BMA with 20% by weight of 1,2-dimethyl-1,1,2,2-tetraphenyldisilane. The thickness of the resist film was 0.9 μm. After exposure to the electron beam, the specimen was subjected to vacuum treatment under a pressure of $1 \times 10^{-5}$ Torr for 2 hours and, then, developed as described in Example 7 for 11 minutes and 20 seconds. The sensitivity was $8.0 \times 10^{-5}$ C/cm².

EXAMPLE 13

Cyclized polyisoprene was coated onto a silcon wafer and heated in a nitrogen stream at 80° C. for 30 minutes. The resin film (first layer) had a thickness of 1 μm. A resist solution of a blend of Pn-BMA with triphenylsilane (23.1% by weight based on the weight of the blend) in cyclohexanone was then coated onto the resin film and heated in a nitrogen stream at 80° C. for 20 minutes. The thickness of the resist film (second layer) was 0.4 μm. The specimen was then exposed to an electron beam produced at an acceleration voltage of 20 kV to an exposure amount of $8 \times 10^{-5}$ C/cm². The specimen was introduced into a reactive ion etching apparatus of the parallel plate type, the pressure was reduced to $6 \times 10^{-5}$ Torr, and oxygen was introduced. The specimen was then developed under the conditions of an oxygen pressure of 0.4 Torr, an electric power of 0.33 watt/cm², and a frequency of 13.56 MHz. The second layer was developed in 4 minutes. Subsequently, the first layer was completely etched in a further 13 minutes. The thickness of the retained film was about 1.3 μm.

EXAMPLE 14

Phenol-formaldehyde resin was coated onto a silicon wafer and heated at 200° C. for 1 hour. The resin film (first layer) had a thickness of 1 μm. A resist solution of a blend of Pn-BMA with 16.7% by weight of diphenylsilanediol in cyclohexanone was then coated onto the resin film and heated in a nitrogen stream at 60° C. for 20 minutes. The thickness of the resist film (second layer) was 0.4 μm. The specimen was exposed to an electron beam to an exposure amount of $1 \times 10^{-5}$ C/cm² (acceleration voltage of 20 kV). The specimen was allowed to stand under a pressure of $1\times10^{-5}$ Torr and was then treated as described in Example 13. The second layer was developed in 5 minutes and, subsequently, the first layer was completely etched in a further 7 minutes. The thickness of the retained film was about 1.3 μm.

EXAMPLE 15

Polyimide resin was coated onto a silicon wafer and heated at 350° C. for 1 hour. The resin film (first layer) had a thickness of 1 μm. A resist solution of Pi-PMA with 16.7% by weight of triphenylsilanol in cyclohexane was then coated onto the resin film and heated in a nitrogen stream at 60° C. for 20 minutes. The thickness of the resist film (second layer) was 0.5 μm. The specimen was exposed to an electron beam to an exposure amount of $8\times10^{-5}$ C/cm² (acceleration voltage of 20 kV). The specimen was allowed to stand under a pressure of $1\times10^{-5}$ Torr and then treated as described in Example 13. The second layer was developed in 7 minutes and, subsequently, the first layer was completely etched in a further 20 minutes. The thickness of the retained film was about 1.3 μm.

We claim:

1. A dry-developing negative resist composition consisting of (a) a polymer of a monomer of the following formula I or II or a copolymer of a monomer of the following formula I with a monomer of the following formula II,

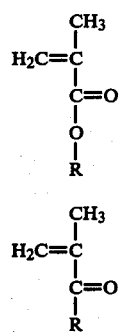

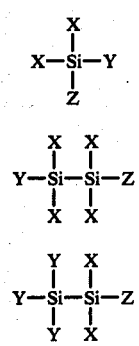

in which R represents an alkyl of 1 to 6 carbon atoms, benzyl, phenyl, or cyclohexyl and (b) 1% to 70% by weight, based on the weight of the composition, of at least one silicon compound, wherein the silicon compound is selected from the group consisting of the compounds of the formulae III, IV, V, VI, and VII, $$\begin{array}{c} X \\ | \\ X-Si-Y \\ | \\ Z \end{array} \quad \text{III}$$

$$\begin{array}{c} X \quad X \\ | \quad | \\ Y-Si-Si-Z \\ | \quad | \\ X \quad X \end{array} \quad \text{IV}$$

$$\begin{array}{c} Y \quad X \\ | \quad | \\ Y-Si-Si-Z \\ | \quad | \\ Y \quad X \end{array} \quad \text{V}$$

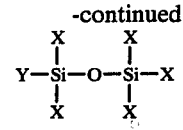

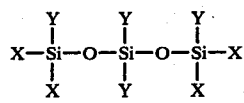

in which each X represents methyl, phenyl, biphenyl, phenylamino, phenoxy, benzyl, cyano, vinyl or acetoxy, each Y represents hydrogen, hydroxy, azido, vinyl, methoxy, ethoxy, butoxy, phenoxy, halogen, benzyl, phenyl, methyl, t-butyl biphenyl or acetoxy, and each Z represents phenyl, hydroxy, vinyl, methoxy, ethoxy, butoxy, benzyl, methyl, t-butyl, phenoxy, halogen, biphenyl, acetoxy or 1,4-bis(hydroxydimethylsilyl)benzene.

2. A resist composition as claimed in claim 1, wherein the silicon compound is contained in the resist composition in an amount of 10% to 50% by weight.

3. A resist composition as claimed in claim 1, wherein the monomer of formula I is selected from methyl methacrylate, ethyl methacrylate, n-propyl methacrylate, i-propyl methacrylate, n-butyl methacrylate, sec-butyl methacrylate, t-butyl methacrylate, n-amyl methacrylate, n-hexyl methacrylate, benzyl methacrylate, phenyl methacrylate, and cyclohexyl methacrylate.

4. A resist composition as claimed in claim 1, wherein the monomer of formula II is selected from methylisopropenyl ketone and phenylisopropenyl ketone.

5. A resist composition as claimed in claim 1, 2, 3 or 4, wherein the silicon compound is selected from the group consisting of bis(p-biphenyl)diphenylsilane, bis(phenylamino)dimethyl-silane, t-butyldimethylchlorosilane, t-butyldiphenyl-chlorosilane, dibenzyldimethylsilane, dicyanodimethylsilane, diphenylsilanediol, tetraacetoxysilane, tetraphenoxysilane, tetraphenysilane, tribenzylchlorosilane, triphenylchlorosilane, triphenylethylsilane, triphenylfluorosilane, triphenylsilane, triphenylsilanol, triphenylsilylazido, triphenylvinylsilane, 1,2-dimethyl-1,1,2,2-tetraphenyl-disilane, 1,1,1-trimethyl-2,2,2-triphenyldisilane, 1,3-dimethyl-1,1,3,3-tetraphenyldisiloxane, 1,3-divinyl-1,1,3,3-tetraphenyldisiloxane, 1,3-ethoxy-1,1,3,3-tetraphenyldisiloxane and 1,1,5,5-tetraphenyl-1,3,3,5-tetramethyltrisiloxane.

6. A process for forming a negative resist pattern on a substrate, comprising coating the substrate with a resist composition as defined in any one of claims 1 to 4, exposing the resist layer to an ionizing radiation to form at least one other silicon compound having a vapor pressure that is lower than the vapor pressure of the original silicon compound, removing at least a part of the non-irradiated portion of said silicon compound by relief treatment and developing a negative resist pattern on the substrate by treatment with gas plasma to remove the non-irradiated portion of the resist composition.

7. A process as claimed in claim 6, wherein the radiation is selected from an electron beam, X-ray, ion beam, and deep ultraviolet radiation.

8. A process as claimed in claim 6, wherein the gas plasma is selected from oxygen plasma, argon gas plasma, mixed oxygen-argon gas plasma, and mixed oxygen-fluorine gas plasma.

9. A process as claimed in claim 6, wherein an intermediate layer is provided between the resist layer and the substrate.

10. A process as claimed in claim 9, wherein the intermediate layer is composed of polyvinyl carbazole, polystyrene, phenol resin, cyclized polyisoprene, or polyimide.

11. The composition of claim 1, 2, 3 or 4, wherein the monomer of formula II is selected from methylisopropenyl ketone and phenylisopropenyl ketone.

12. The composition of claim 1, 2, 3 or 4, each said polymer or copolymer of each said monomer having a molecular weight in the range from 8 to $45 \times 10^4$ and a dispersion in the range from 1.4 to 3.2.

13. The composition of claim 1, 2, 3 or 4, each said polymer and copolymer of each said monomer having a molecular weight in the range from 8 to $45 \times 10^4$ and a dispersion in the range from 1.4 to 3.2.

14. The composition of claim 11, each said polymer and copolymer of each said monomer having a molecular weight in the range from 8 to $45 \times 10^4$ and a dispersion in the range from 1.4 to 3.2.

15. The method of claim 6, including converting said further silicon compound in said irradiated portions of said resist composition, by exposure to a plasma, into a substance having a greater resistance to plasma etching.

* * * * *

UNITED STATES PATENT AND TRADEMARK OFFICE
CERTIFICATE OF CORRECTION

PATENT NO. : 4,464,455

DATED : August 7, 1984

INVENTOR(S) : Yoneda et al.

It is certified that error appears in the above-identified patent and that said Letters Patent is hereby corrected as shown below:

Title page, at [56]:

Under "U.S. Patent Documents" please add:

--3,758,306    Roos
  4,004,044    Franco et al.
  3,535,137    Haller et al.--;

and

Under "Foreign Patent Documents" please add:

--2,303,671    Germany
  2,217,774    Germany
  1,376,114    United Kingdom--.

Title page, at [57]:

Abstract, line 18, "silicone" should be --silicon--.

Col. 2, line 16, 19 and 20, change "silicone" to --silicon--;

UNITED STATES PATENT AND TRADEMARK OFFICE
CERTIFICATE OF CORRECTION

PATENT NO. : 4,464,455

DATED : August 7, 1984

INVENTOR(S) : Yoneda et al.

It is certified that error appears in the above-identified patent and that said Letters Patent is hereby corrected as shown below:

line 62, in formula "VI", "Si-X should be --Si-Z--.

Col. 3, line 44, "ortreat" should be --or treat--.

Col. 8, formula "VI", at line 4, "Si-X" should be --Si-Z--.

Signed and Sealed this

Twelfth Day of April, 1988

*Attest:*

DONALD J. QUIGG

*Attesting Officer*          *Commissioner of Patents and Trademarks*